US006993441B1

(12) United States Patent
Tsyrganovich

(10) Patent No.: US 6,993,441 B1
(45) Date of Patent: Jan. 31, 2006

(54) ADAPTIVE ERROR CORRECTION IN AN OVERSAMPLED ADC

(75) Inventor: Anatoliy V. Tsyrganovich, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 20 days.

(21) Appl. No.: 10/844,901

(22) Filed: May 12, 2004

(51) Int. Cl.
*G06F 19/00* (2006.01)
(52) U.S. Cl. .................. 702/69; 702/107; 341/120
(58) Field of Classification Search ................. 702/85, 702/104, 107, 109, 69; 341/120, 121, 126, 341/138
See application file for complete search history.

(56) References Cited

U.S. PATENT DOCUMENTS

| 5,361,067 | A | * | 11/1994 | Pinckley ..................... 341/120 |
| 5,861,826 | A | | 1/1999 | Shu et al. ................... 341/120 |
| 6,642,869 | B2 | * | 11/2003 | Kuyel et al. ................ 341/120 |
| 6,704,673 | B2 | * | 3/2004 | McTigue et al. ............ 702/107 |
| 6,774,828 | B1 | * | 8/2004 | Lee et al. ................... 341/118 |
| 6,839,010 | B1 | * | 1/2005 | Tsyrganovich .............. 341/143 |
| 6,861,967 | B2 | * | 3/2005 | Tanizawa .................... 341/118 |
| 6,897,794 | B2 | * | 5/2005 | Kuyel et al. ................ 341/120 |
| 6,907,374 | B1 | * | 6/2005 | Tsyrganovich .............. 702/107 |
| 2003/0160713 | A1 | * | 8/2003 | Kuyel et al. ................ 341/120 |

OTHER PUBLICATIONS

Albert O'Grady, "Getting 14-Bit Performance from a 32-Channel 14-Bit String ADC," in Analog Dialogue, vol. 37-2, pp. 3-6, Feb. 2003, 16 pages.

Yun Chiu et al., "Least Mean Square Adaptive Digital Background Calibration of Pipelined Analog-to-Digital Converters," in IEEE Transactions On Circuits and Systems, vol. 51, No. 1, pp. 38-46, Jan. 2004.

D. Weiler et al., "Single Bit Sigma-Delta Modulator with Nonlinear Quantization for u-Law Coding," Fraunhofer Institute, Duisburg, Germany, 4 pages downloaded from Internet on Apr. 20, 2004 at www.imec.be/esscirc/papers-97/169.pdf, no date, perhaps 1997.

* cited by examiner

*Primary Examiner*—Patrick J. Assouad
(74) *Attorney, Agent, or Firm*—Silicon Edge Law Group LLP; Darien K. Wallace; T. Lester Wallace

(57) ABSTRACT

An analog-to-digital converter (ADC) exhibiting an uncorrected non-linear transfer function receives measured analog voltage amplitudes and outputs uncorrected digital values. A calibration circuit receives each uncorrected digital value and outputs a corrected digital value. The measured analog voltage amplitudes received by the ADC and the corresponding corrected digital values output by the calibration circuit define points approximating an ideal linear transfer function of the ADC. The calibration circuit performs piece-wise-linear approximation of the uncorrected transfer function and associates each uncorrected digital value with the applicable linear segment that passes through a segment endpoint on the uncorrected transfer function. The calibration circuit calculates each corrected digital value using calibration coefficients associated with the applicable linear segment, such as the slope of the linear segment. The calibration circuit determines the calibration coefficients by calculating the second derivative of the uncorrected transfer function. The calibration coefficients are stored in non-volatile memory.

25 Claims, 8 Drawing Sheets

US 6,993,441 B1

ADAPTIVE ERROR CORRECTION IN AN OVERSAMPLED ADC

TECHNICAL FIELD

The present invention relates to analog-to-digital converters, and more specifically to a memory-saving method of calibrating analog-to-digital converters.

BACKGROUND

Analog-to-digital converters (ADCs) are widely used to convert analog voltage signals into digital output signals. ADCs are often embedded with other components in integrated circuits, for example, in microcontrollers. The performance of ADCs that are embedded in integrated circuits is often worse than the performance of standalone ADCs with the same specification. The presence of noise on signal lines and power supply lines often results in higher signal interference and output errors in embedded ADCs. Another source of errors in ADCs is the nonlinearity of the transfer functions of the ADCs. Thus, calibrating embedded ADCs to correct for errors can significantly enhance performance.

Ideally, the Vin versus Dout transfer function of an ADC is a straight line. A linearly increasing voltage amplitude is ideally converted by the ADC into a linearly increasing digital value. The extent to which an ADC receives an analog input signal with a linearly increasing voltage amplitude and outputs digital values that do not linearly increase in value is referred to as "integral nonlinearity error" (INL error). An ADC exhibits differential non-linearity (DNL) error, the derivative of INL error, where it outputs discontinuous digital values in response to a smoothly changing voltage input. DNL error is the extent to which the digital values output by an ADC do not increase by steps of 1 LSB as the analog input voltage increases gradually. An ADC ideally converts an input of the minimum voltage into a digital value of all zeros. The extent to which the digital output value deviates from digital zero is referred to as "dc offset error." An ADC ideally converts an input of the maximum voltage into a digital value of all ones. The extent to which the digital output value output deviates from all digital ones is referred to as "gain error."

There are various known methods for calibrating ADCs to correct for gain error, dc offset error, INL error and DNL error. In one method, the uncorrected digital output of an ADC with a nonlinear transfer function is mapped to the ideal linear transfer function. The calibration method determines a correction factor for each uncorrected digital value output by the ADC and stores the uncorrected value and its associated correction factor in a lookup table. A calibration circuit outputs a corrected digital value on the ideal linear transfer function by adding the appropriate correction factor to each uncorrected digital value output by the ADC. Valuable memory resources must be allocated to the lookup table. A calibration method that consumes less memory resources for a lookup table would be particularly advantageous in an ADC that is embedded in a microcontroller.

Another calibration method involves piecewise linear segmentation. The entire dynamic range of the uncorrected output of an ADC is divided into equally-spaced ranges of digital values. A best-fitting linear segment is then mapped to the distribution of digital values within in each range. Each uncorrected digital output value is associated with a point on a linear segment. Correction factors are then calculated for each point along each linear segment. The output of the ADC is corrected by adding to each uncorrected digital value the correction factor associated with the closest point on the appropriate linear segment.

A calibration method that divides an uncorrected nonlinear transfer function into segments of approximately equal length is less accurate for segments where the uncorrected transfer function is most nonlinear. Moreover, depending on the shape of the uncorrected transfer function, calculating correction factors with additional segments does not necessarily render the calibration more accurate. For an uncorrected, hockey-stick-shaped transfer function, for example, approximating the uncorrected transfer function with successive linear segments along the handle does not provide a better fit than would a single linear segment. Calculating correction factors for the successive linear segments does not significantly improve the resolution of the ADC.

A method is sought for calibrating an analog-to-digital converter that reduces the memory used to store correction factors and that also reduces any calculations that do not significantly improve the resolution of the analog-to-digital converter.

SUMMARY

An analog-to-digital converter (ADC) that exhibits an uncorrected non-linear transfer function receives measured analog voltage amplitudes and outputs uncorrected digital values. A calibration circuit receives each uncorrected digital value and outputs a corrected digital value. The calibration circuit performs piecewise-linear approximation of the uncorrected non-linear transfer function and associates each uncorrected digital value with the applicable linear segment that passes through a segment endpoint on the uncorrected transfer function. The corrected digital values output by the calibration circuit and the corresponding measured analog voltage amplitudes received by the ADC define points approximating an ideal linear transfer function of the ADC. In one embodiment, the calculation circuit is the processing unit of a microcontroller.

The calibration circuit calculates each corrected digital value using calibration coefficients associated with the applicable linear segment. One calibration coefficient is the endpoint digital value of a segment endpoint of each linear segment. Another calibration coefficient is the slope of each linear segment. The calibration circuit determines the calibration coefficients by calculating the second derivative of the uncorrected transfer function. The segment endpoint of each linear segment is located on the uncorrected transfer function at a local maximum of a second derivative of the uncorrected transfer function.

The calibration coefficients are stored in non-volatile memory. The corrected digital values are generated using three calibration coefficients plus four additional calibration coefficients for each segment of the piecewise-linear approximation of the uncorrected transfer function. Thus, the calibration circuit can generate the corrected digital values using fewer calibration coefficients than the predetermined number of digital values into which the ADC converts the measured analog voltage amplitudes.

A method calibrates an ADC having a non-linear transfer function by receiving a plurality of uncorrected digital values from the ADC and by outputting a plurality of corrected digital values that approximately track the ideal linear transfer function of the ADC. The method approximates the non-linear transfer function with linear segments. A segment endpoint of each linear segment is located on the non-linear transfer function at a local maximum of the second derivative of the non-linear transfer function. The method calculates a corrected digital value for each uncorrected digital value using calibration coefficients associated with the linear segment applicable to the uncorrected digital value. The calibration coefficients include the endpoint digital values of segment endpoints of each linear segment. The method stores the calibration coefficients in non-volatile memory. In one embodiment, corrected digital values are not generated by adding a separate, stored correction factor to each uncorrected digital value.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
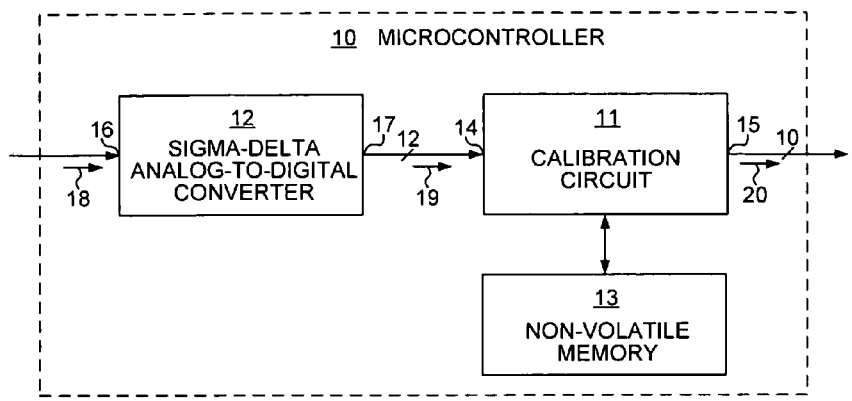
FIG. 1 is a simplified schematic block diagram of a calibration circuit and an analog-to-digital (ADC) converted embedded in a microcontroller.

FIG. 1 shows microcontroller integrated circuit 10 with a calibration circuit 11, an embedded sigma-delta analog-to-digital converter (ADC) 12, and a non-volatile memory 13. Calibration circuit 11 has an input bus 14 and an output bus 15. ADC 12 has an input lead 16 and an output bus 17. ADC 12 receives a continuous analog input signal on input lead 16. The continuous analog input signal comprises a plurality of measured analog voltage amplitudes 18.

ADC 12 oversamples the continuous analog input signal at a sampling frequency that is at least twice as great as the frequency of the analog input signal. Oversampling spreads quantization noise over a wide frequency range. ADC 12 converts the plurality of measured analog voltage amplitudes 18 into a corresponding plurality of uncorrected digital values 19. Each of the plurality of measured analog voltage amplitudes 18 is ideally converted into one of a predetermined number of possible digital values. In this embodiment, measured analog voltage amplitudes 18 are ideally converted into 1024 ($2^{10}$) possible 10-bit digital values. Each uncorrected digital value 19, however, has twelve bits so that those uncorrected digital values that fall outside the 1024 possible 10-bit digital states can be represented. Each uncorrected digital value 19 has ten regular bits, a sign bit, and an overflow bit. ADC 12 outputs the plurality of 12-bit uncorrected digital values 19 onto 12-bit output bus 17.

Each measured analog voltage amplitude and the corresponding uncorrected digital value define a point on an uncorrected transfer function of ADC 12. The uncorrected transfer function of ADC 12 is not linear. The plurality of uncorrected digital values 19 exhibits gain error, dc offset error, INL error and DNL error. ADC 12 would ideally convert linearly increasing analog voltage amplitudes into linearly increasing digital values, resulting in an ideal linear transfer function.

Calibration circuit 11 receives the plurality of uncorrected digital values 19 onto input bus 14 and outputs a plurality of corrected digital values 20 onto output bus 15. Calibration circuit 11 corrects for total error such that the plurality of measured analog voltage amplitudes 18 received by ADC 12 and the corresponding plurality of corrected digital values 20 output by calibration circuit 11 define points approximating the ideal linear transfer function of ADC 12. Thus, calibration circuit 11 does not separately correct for gain error, dc offset error, INL error and DNL error. Calibration circuit 11 generates the corrected digital values 20 using calibration coefficients that correspond to linear segments that approximate the plurality of uncorrected digital values 19. For each measured analog voltage amplitude received by ADC 12, calibration circuit 11 is capable of calculating a corrected digital value to within +/−one half of the least significant bit (LSB) of the digital value that corresponds to the measured analog voltage amplitude on the ideal linear transfer function.

Figure 2:
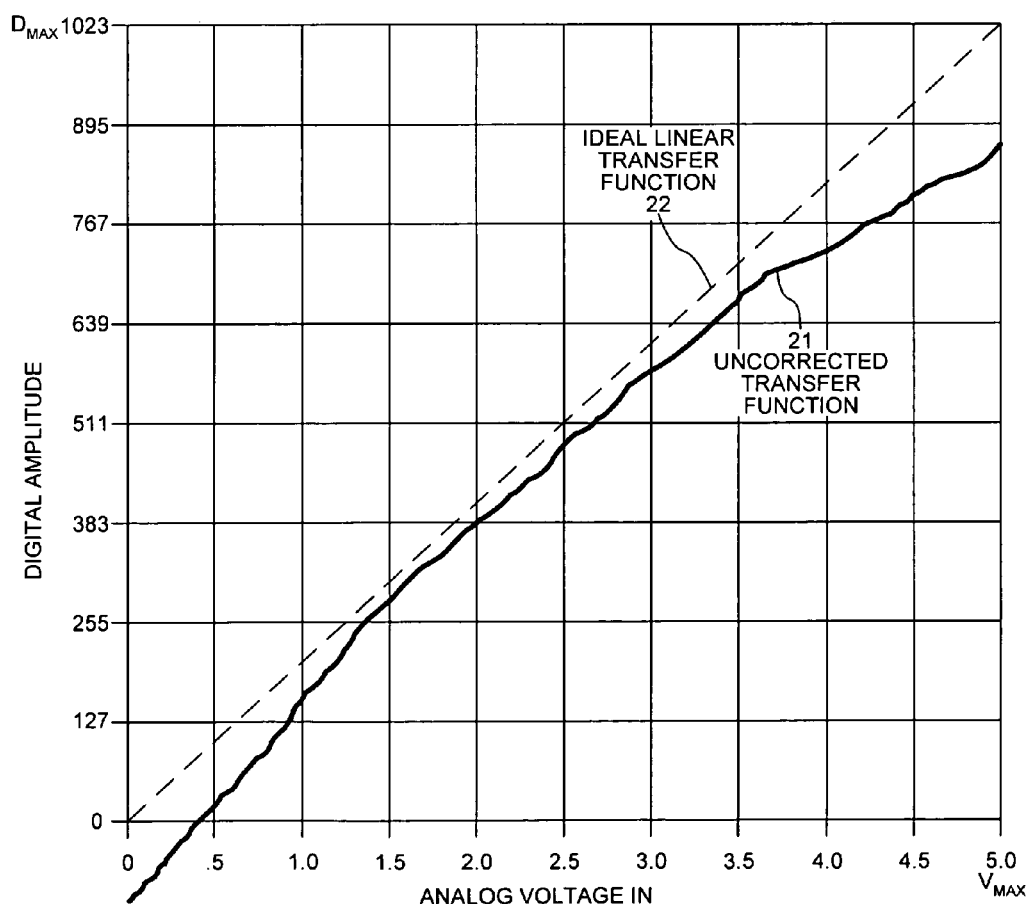
FIG. 2 is a graph of an uncorrected, nonlinear transfer function of the ADC of FIG. 1.

FIG. 2 is a graph of a hypothetical, uncorrected transfer function 21 of ADC 12, as well as an ideal linear transfer function 22 for ADC 12. Uncorrected transfer function 21 correlates physically measured analog voltage amplitudes received by ADC 12 to uncorrected digital values output by ADC 12. ADC 12 outputs the uncorrected digital values as 12-bit digital values. FIG. 2 shows that DC offset error causes a portion of uncorrected transfer function 21 to extend into negative digital amplitudes. The uncorrected digital values 19 in this negative portion of uncorrected transfer function 21 are output by ADC 12 as negatively signed digital numbers.

Figure 3:
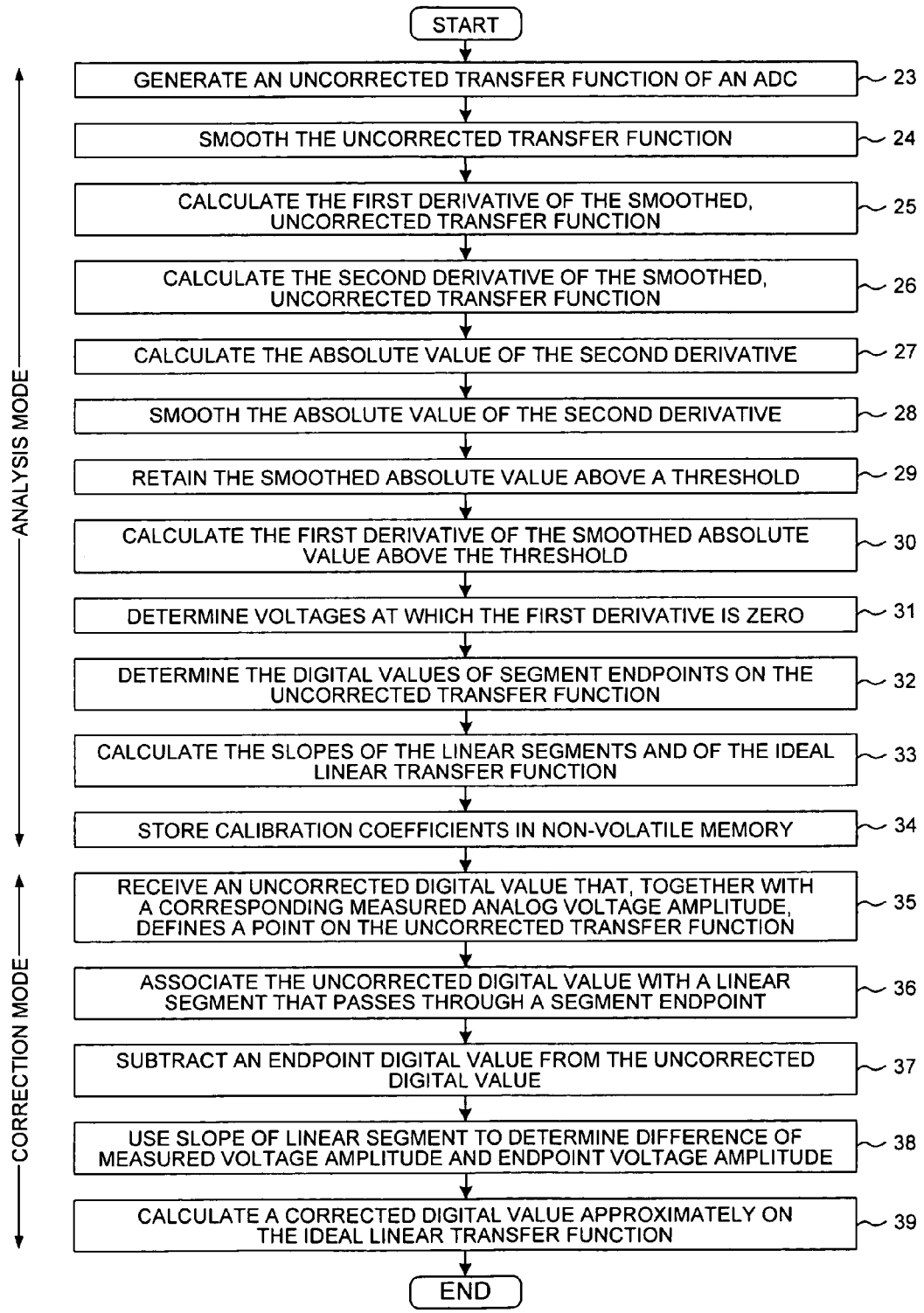
FIG. 3 is a flowchart of steps whereby the calibration circuit of FIG. 1 calibrates the ADC of FIG. 1.

FIG. 3 is a flowchart illustrating steps 23–39 of a method by which calibration circuit 11 receives the plurality of uncorrected digital values 19 and outputs the plurality of corrected digital values 20. Calibration circuit 11 thereby calibrates uncorrected, nonlinear transfer function 21 of ADC 12 by outputting the plurality of corrected digital values 20 that approximately track ideal linear transfer function 22. In a first step 23, ADC 12 generates uncorrected transfer function 21. Each point on uncorrected transfer function 21 is defined by a measured analog voltage amplitude and a corresponding uncorrected digital value. In an analysis mode of microcontroller 10, uncorrected transfer function 21 is analyzed. The analysis mode is, for example, performed during testing after production. Subsequent steps of FIG. 3 are now described in relation to the functions shown in the graphs of FIGS. 4–9.

The analysis mode consists of steps 23 through 34, in which inflection points on uncorrected transfer function 21 are determined. Uncorrected transfer function 21 is then approximated as multiple piecewise-linear segments, wherein the linear segments join at the inflection points of uncorrected transfer function 21. The number of linear segments is one more than the number of inflection points, unlike in other calibration methods where the number of linear segments is defined irrespective of characteristics of the uncorrected transfer function.

Figure 4:
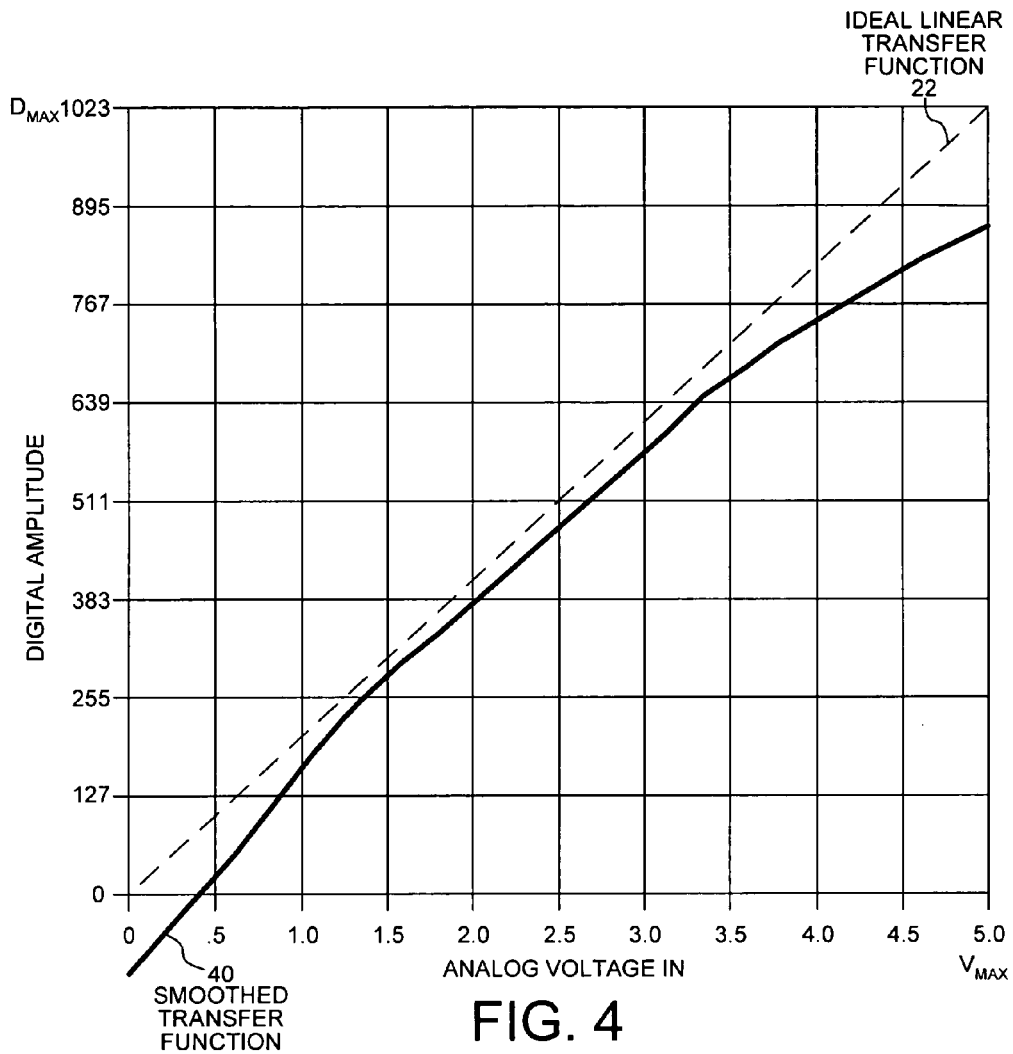
FIG. 4 is a graph of the transfer function of FIG. 2 after being smoothed.

In a step 24, uncorrected transfer function 21 is smoothed by filtering in test equipment. FIG. 4 shows the resulting smoothed, uncorrected transfer function 40. Step 24 is not essential to the method of FIG. 3. The smoothing of uncorrected transfer function 21 reduces the number of closely-spaced inflection points and, therefore, prevents short linear segments to be used in the approximation of uncorrected transfer function 21. Smoothing reduces the number of calibration coefficients used in the method of FIG. 3, but also reduces the resolution of the calibration achieved by calibration circuit 11.

Figure 5:
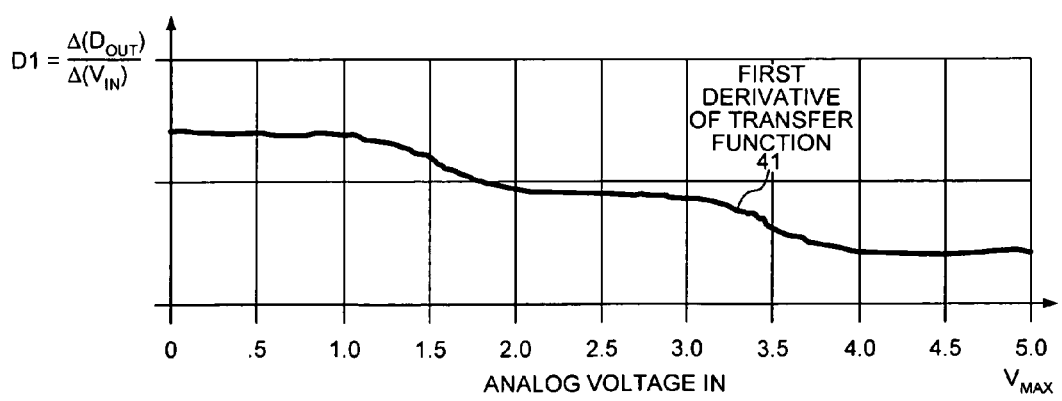
FIG. 5 is a graph of the first derivative of the transfer function of FIG. 4.

In a step 25, the first derivative of the smoothed, uncorrected transfer function 40 is determined. FIG. 5 is a graph of the first derivative (D1) 41 of smoothed, uncorrected transfer function 40. First derivative (D1) 41 depicts the change of uncorrected digital values of smoothed transfer function 40 in relation to the change in the measured input analog voltage amplitude.

Figure 6A:
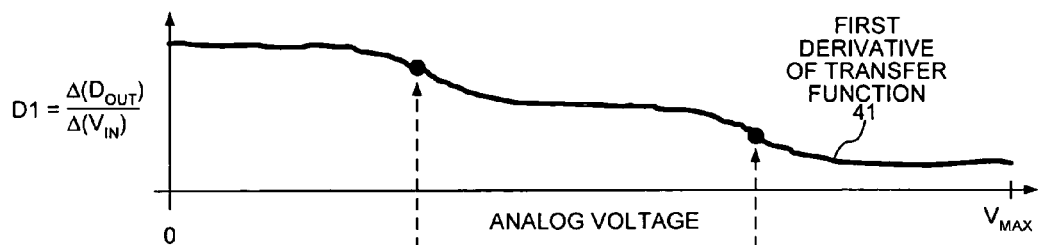
FIGS. 6A–H are graphs of derivative and absolute value functions of the first derivative function of FIG. 5.
Figure 6B:
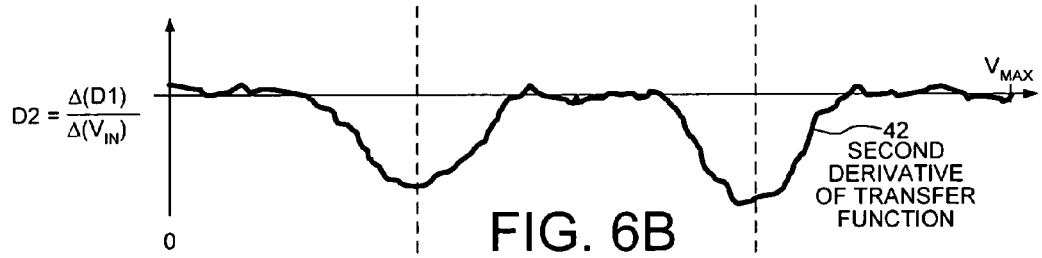

In a step 26, the second derivative of smoothed, uncorrected transfer function 40 is calculated. FIG. 6B shows the second derivative (D2) 42 of the smoothed, uncorrected transfer function 40. Second derivative (D2) 42 depicts the change of first derivative (D1) 41 in relation to the change in the measured input analog voltage amplitude.

Figure 6C:
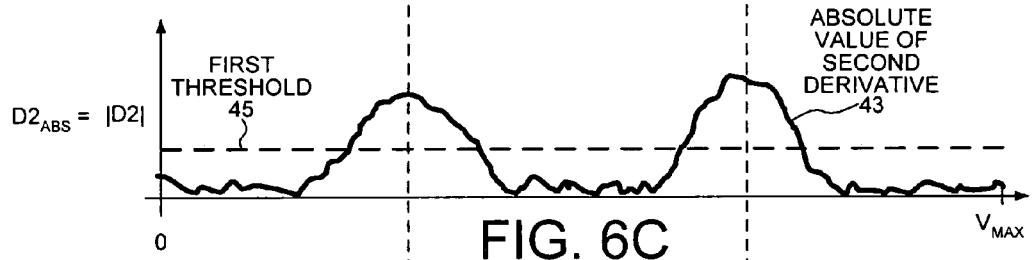

In a step 27, the absolute value of second derivative 42 of smoothed, uncorrected transfer function 40 is calculated. FIG. 6C shows the absolute value ($D2_{ABS}$) 43 of second derivative (D2) 42.

Figure 6D:
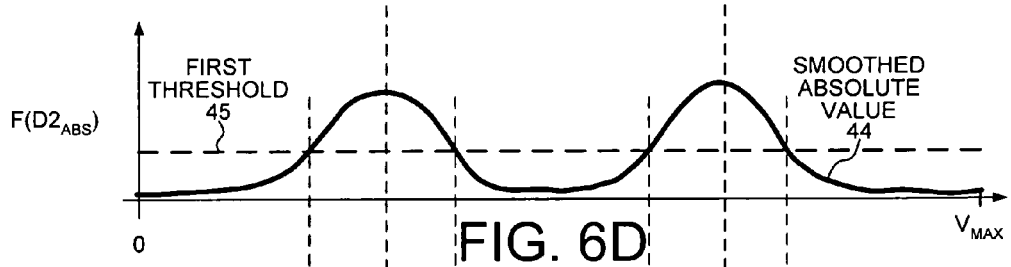

In a step 28, absolute value ($D2_{ABS}$) 43 of second derivative (D2) 42 is filtered to generate a smoothed function. FIG. 6D shows the smoothed absolute value $F(D2_{ABS})$ 44 of second derivative (D2) 42.

In a step 29, points on smoothed absolute value $F(D2_{ABS})$ 44 are discarded for amplitude values that fall below first threshold 45. First threshold 45 is placed at an amplitude above the noise level of absolute value ($D2_{ABS}$) 43 and smoothed absolute value $F(D2_{ABS})$ 44. By lowering threshold 45 to an amplitude just above the noise level, the piecewise-linear segments approximate uncorrected transfer function 21 to a resolution of less than +/−½ LSB. Therefore, calibration circuit 11 can correct for DNL error that is greater than +/−½ LSB. DNL error of greater than +/−½ LSB would result in one bit of effective resolution being lost. Further increases in DNL error would cause a missing code phenomenon.

Figure 6E:
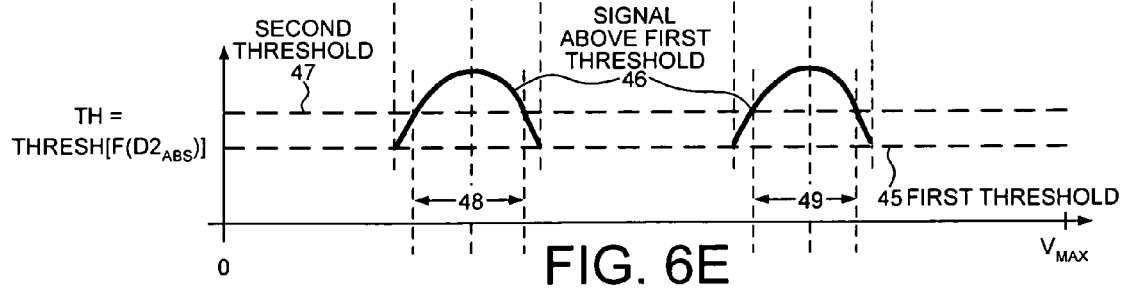

FIG. 6E shows the portions (TH) 46 of smoothed absolute value $F(D2_{ABS})$ 44 that are retained above first threshold 45. A higher second threshold 47 is then applied to the portions (TH) 46 in order to define valid ranges of input analog voltage in which inflection points on uncorrected transfer function 21 can be located. Two valid ranges 48–49 of input analog voltage are shown in FIG. 6E.

Figure 6F:
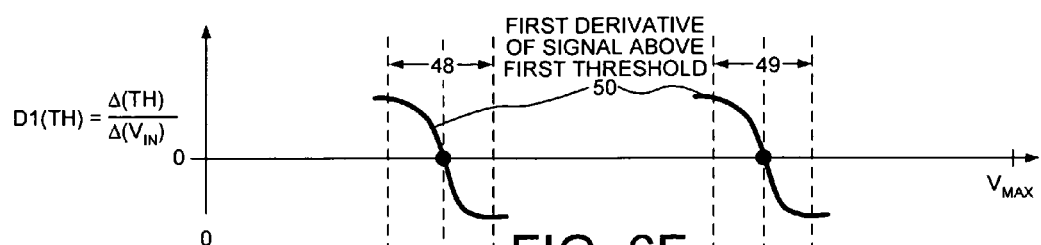
Figure 6G:
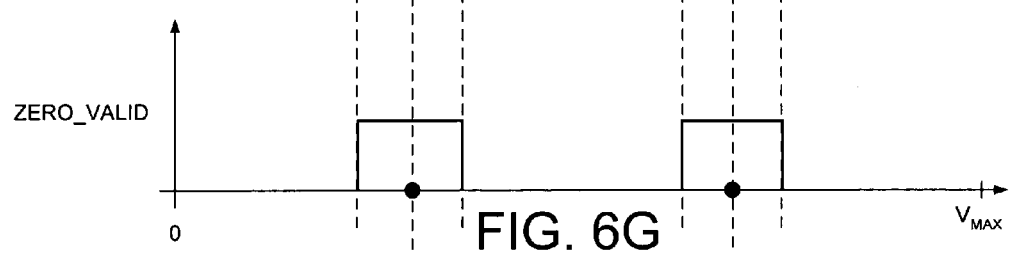

In a step 30, the first derivative of the portions (TH) 46 of smoothed absolute value $F(D2_{ABS})$ 44 are calculated. FIG. 6F shows the first derivative D1(TH) 50 of the portions (TH) 46. First derivative D1(TH) 50 depicts the change of portions (TH) 46 in relation to the change in the measured input analog voltage amplitude. A zero crossing signal is generated at the points where first derivative D1(TH) 50 crosses zero. A zero valid signal (ZERO_VALID) is generated that indicates the zero-crossing points of the zero crossing signal that fall within the valid ranges 48–49 determined with second threshold 47.

Figure 6H:
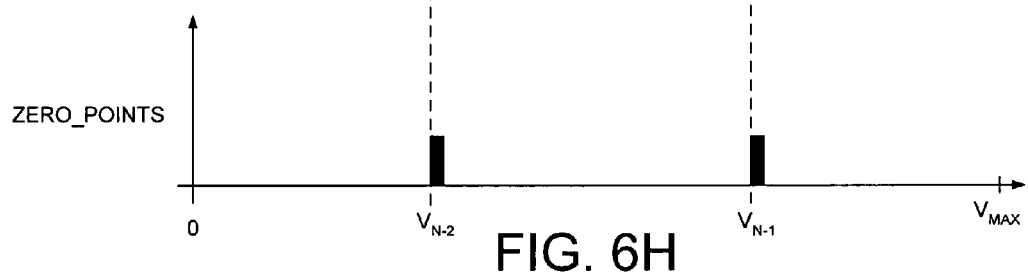

In a step 31, the measured input analog voltage amplitudes are determined for the valid zero-crossing points. FIG. 6H shows a ZERO_POINTS signal indicating two input analog voltage amplitudes $V_{N-1}$ and $V_{N-2}$ corresponding to inflection points on uncorrected transfer function 21.

Figure 7:
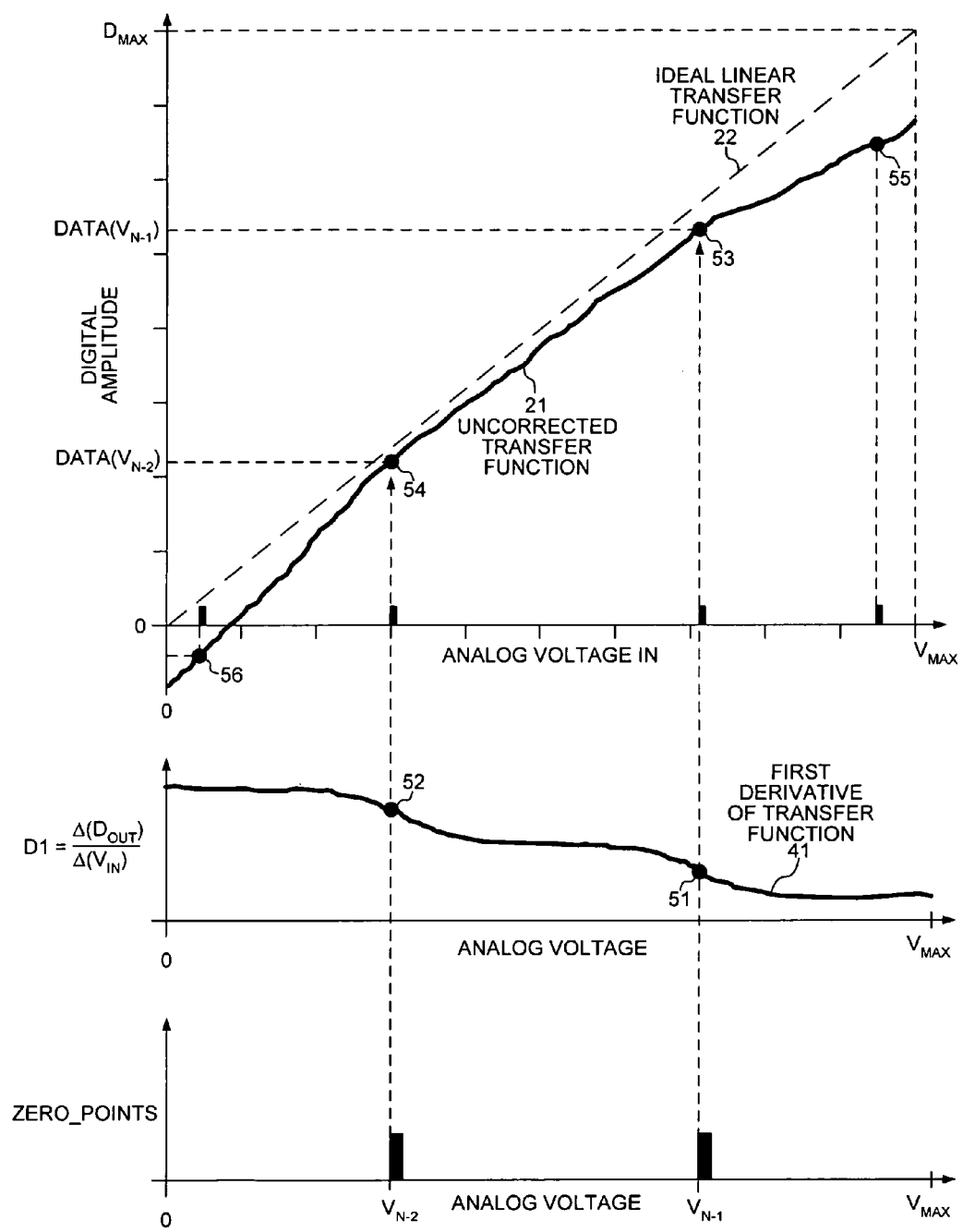
FIG. 7 shows three graphs correlating input analog voltage amplitudes to corresponding inflection points on the first derivative of FIG. 4 and the uncorrected transfer function of FIG. 1.

In a step 32, the digital values of the inflection points on uncorrected transfer function 21 that correspond to the valid zero-crossing points are determined. FIG. 7 illustrates that the two input analog voltage amplitudes $V_{N-1}$ and $V_{N-2}$ correspond to inflection points 51–52 on first derivative (D1) 41 and to inflection points 53–54 on uncorrected transfer function 21. Inflection points 53–54 represent points at which uncorrected transfer function 21 changes its slope by an amount greater than the slope changes indicated by local maxima of function 43 below first threshold 45 in FIG. 6C. The digital values $DATA(V_{N-1})$ and $DATA(V_{N-2})$ of the inflection points 53–54 on uncorrected transfer function 21 are then determined empirically in the analysis mode.

End points 55–56 on uncorrected transfer function 21 are then empirically chosen that correspond to the ends of the dynamic range of ADC 12. Inflection points 53–54 and end points 55–56 are defined to be segment endpoints on uncorrected transfer function 21. Uncorrected transfer function 21 is then approximated by three linear segments that connect the two inflection points 53–54 and the end points 55–56.

Figure 8:
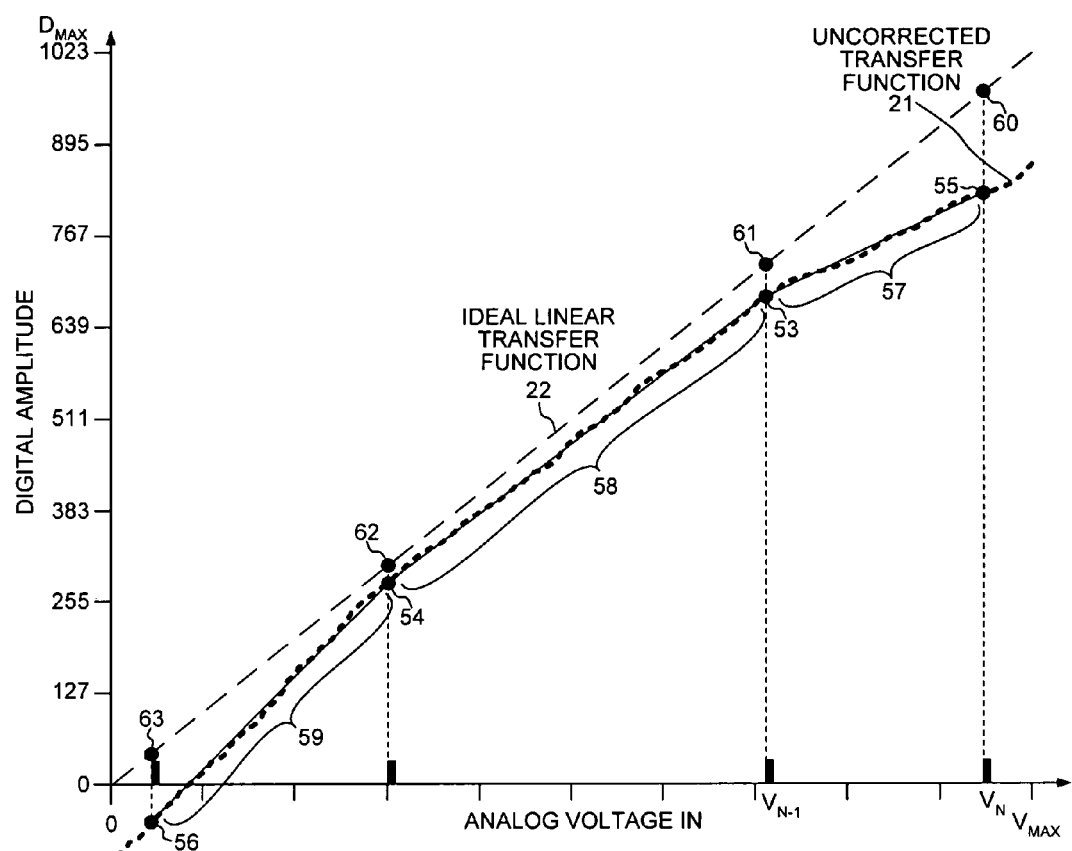
FIG. 8 illustrates the uncorrected transfer function of FIG. 1 being approximated by three linear segments.

FIG. 8 shows that uncorrected transfer function 21 is approximated by three linear segments 57–59. Linear segment 57 joins end point 55 and inflection point 53; linear segment 58 joins inflection point 53 and inflection point 54; and linear segment 59 joins inflection point 54 and end point 56. Uncorrected transfer function 21 is a relatively smooth function and is accurately approximated with just three linear segments. The method of FIG. 3 approximates uncorrected transfer function 21 with fewer linear segments than would have resulted from a conventional piecewise-linear approximation that inserts a linear segment for each predetermined range of digital values. For example, where a conventional piecewise-linear approximation inserts a linear segment for each range of two hundred digital values, uncorrected transfer function 21 would be approximated with about five linear segments. An approximation using five segments over equal digital ranges, as opposed to the three segments generated by the method of FIG. 3, would involve more calculations but would nevertheless result in poorer resolution. The method of FIG. 3 places the endpoints of the linear segments only at inflection points of uncorrected transfer function 21 and thereby concentrates the linear segments in curvy areas of the uncorrected transfer function, which both reduces the number of calibration coefficients and improves resolution.

Figure 9:
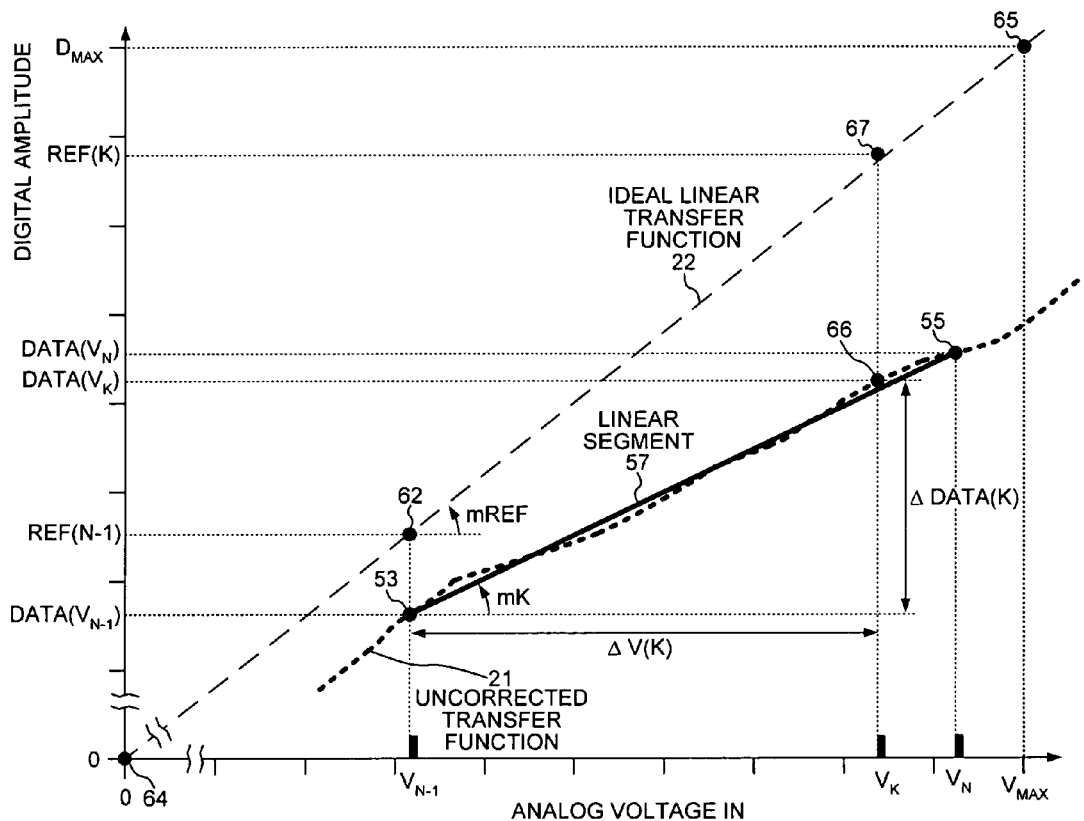
FIG. 9 illustrates the calculation of the slope of one linear segment of FIG. 8.

In a step 33, the slopes of ideal linear transfer function 22 and of the linear segments 57–59 are calculated. FIG. 9 shows a portion of the graph of FIG. 8 and illustrates the calculation of the slope of ideal linear transfer function 22 and the slope of linear segment 57. Still in the analysis mode, the end points of ideal linear transfer function 22 are empirically determined. Ideal linear transfer function 22 extends from point 64 ($V_{MIN}$, $D_{MIN}$) to point 65 ($V_{MAX}$, $D_{MAX}$). In this example, $V_{MIN}$ is zero volts and $D_{MIN}$ is digital zero; $V_{MAX}$ is five volts and $D_{MAX}$ is 1023. The slope (mREF) of ideal linear transfer function 22 is $(D_{MAX}-D_{MIN})/(V_{MAX}-V_{MIN})$ or, in this example, 1023/5 volts. End point 53 of linear segment 57 has the coordinates ($V_{N-1}$, $DATA(V_{N-1})$). End point 55 has the coordinates ($V_N$, $DATA(V_N)$). Thus, the slope (mK) of linear segment 57 is $[DATA(V_N)-DATA(V_{N-1})]/(V_N-V_{N-1})$.

In step 33, the digital values of points 60–63 on ideal linear transfer function 22 are also determined empirically. Points 60–63 have the same x-coordinates (analog voltage) as do end point 55, inflection points 53–54 and end points 56, respectively. For example, the digital value of point 62 with an x-coordinate of $V_{N-1}$ is empirically determined to have a digital value of REF(N-1).

In a last step 34 of the analysis mode, certain calibration coefficients are stored in non-volatile memory 13. Non-volatile memory 13 can be, for instance, EEPROM or FLASH memory. The slope (mREF) of ideal linear transfer function 22, the digital value DATA($V_N$) of the upper endpoint 55 of the highest linear segment 57, as well as $D_{MIN}$, are stored in non-volatile memory 13. Moreover, four additional calibration coefficients are stored for each segment of the piecewise-linear approximation of uncorrected transfer function 21. For linear segment 57, for example, $V_{N-1}$, DATA($V_{N-1}$), mK and REF(N-1) are stored, where REF(N-1) is the digital value of the point on ideal linear transfer function 22 that corresponds to endpoint 53 of linear segment 57. $V_{N-1}$ is stored as a digital number. Where uncorrected transfer function 21 has been approximated by three linear segments, as shown in FIG. 8, fifteen calibration coefficients are stored in non-volatile memory 13 of microcontroller 12. Thus, considerably less memory is used in the calibration method of FIG. 3 than is used in conventional calibration methods that store a correction factor in memory for each uncorrected digital value output by an analog-to-digital converter that is to be calibrated.

A correction mode consists of steps 35 through 39, in which calibration circuit 11 receives the plurality of uncorrected digital values 19 and uses the calibration coefficients determined in the analysis mode to generate the plurality of corrected digital values 20. The analysis mode is used in the actual operation of microcontroller 10.

In a step 35, calibration circuit 11 receives the plurality of uncorrected digital values 19 from ADC 12, including an uncorrected digital value DATA($V_K$). The uncorrected digital value DATA($V_K$) and a corresponding measured analog voltage amplitude $V_K$ define a point 66 on uncorrected transfer function 21.

In a step 36, calibration circuit 11 associates uncorrected digital value DATA($V_K$) with linear segment 57 and endpoint 53. Calibration circuit 11 associates uncorrected digital value DATA($V_K$) with linear segment 57 by determining that uncorrected digital value DATA($V_K$) is less than or equal to DATA($V_N$) and greater than DATA($V_{N-1}$).

In a step 37, a digital difference ΔDATA(K) is determined by subtracting the digital value DATA($V_{N-1}$) of endpoint 53 from the uncorrected digital value DATA ($V_K$). Then in a step 38, the voltage difference ΔV(K) between the measured analog voltage amplitude $V_K$ and the analog voltage amplitude $V_{N-1}$ of endpoint 53 is calculated digitally using the slope mK of linear segment 57. The voltage difference ΔV(K) is calculated as the digital difference ΔDATA(K) divided by the slope mK. As point 66 on uncorrected transfer function 21 may not lie exactly on linear segment 57, the voltage difference ΔV(K) is an approximation of the actual voltage difference between the measured analog voltage amplitude $V_K$ and the analog voltage amplitude $V_{N-1}$ of endpoint 53.

In a final step 39, a corrected digital value REF(K) is determined. REF(K) is the digital value approximately on ideal linear transfer function 22 that corresponds to measured analog voltage amplitude $V_K$. Corrected digital value REF(K) is calculated by extrapolation from point 62 on ideal linear transfer function 22. Corrected digital value REF(K) is calculated as the voltage difference ΔV(K) multiplied by the slope mREF, plus the digital value REF(N-1) of point 62. FIG. 9 shows a point 67 that lies approximately on ideal linear transfer function 22 and has the coordinates ($V_K$, REF(K)).

Calibration circuit 11 calculates and outputs a corrected digital value for each uncorrected digital value received. Thus, calibration circuit 11 outputs the plurality of corrected digital values 20 that approximately track ideal linear transfer function 22. Each of the corrected digital values 20 fall within the digital range ($D_{MIN}$ to $D_{MAX}$) of ideal linear transfer function 22 and can be expressed as a 10-bit digital value. Thus, no sign bit or overflow bit is required, and the plurality of corrected digital values 20 can be output onto 10-bit output bus 15.

In one embodiment, calibration circuit 11 is part of a processing unit of microcontroller 10. Microcontroller 10 is, for example, a Z8 Encore! microcontroller manufactured by Zilog, Inc. The calculations of steps 24–39 are performed by an arithmetic and logical unit (ALU) within the processing unit of microcontroller 10. In another embodiment, the calculations of steps 24–39 are performed in a hardwired calculation circuit separate from the processing unit. The hardwired calculation circuit can be a state machine or engine.

Although the present invention has been described in connection with certain specific embodiments for instructional purposes, the present invention is not limited thereto. Although steps 24 through 34 of the analysis mode are described above as being performed during testing of microcontroller 10, the calibration coefficients can be recalculated before each use of ADC 12. Determining updated calibration coefficients prior to each use of ADC 12 can correct for such factors as the current temperature of microcontroller 10, a lowered maximum voltage $V_{MAX}$ output by the power source of microcontroller 10 and changing characteristics of components of microcontroller 10 caused by aging. Accordingly, various modifications, adaptations, and combinations of various features of the described embodiments can be practiced without departing from the scope of the invention as set forth in the claims.

What is claimed is:

1. An integrated circuit comprising:
   (a) an analog-to-digital converter that converts a measured analog voltage amplitude to an uncorrected digital value, wherein the measured analog voltage amplitude and the uncorrected digital value define a point on an uncorrected transfer function of the analog-to-digital converter;
   (b) a calibration circuit that receives the uncorrected digital value and outputs a corrected digital value, wherein the uncorrected digital value is associated with a linear segment that passes through a segment endpoint on the uncorrected transfer function, wherein the segment endpoint has an endpoint digital value, and wherein the calibration circuit calculates the corrected digital value by subtracting the endpoint digital value from the uncorrected digital value; and
   (c) a non-volatile memory, wherein the endpoint digital value is stored in a memory location of the non-volatile memory.

2. An integrated circuit comprising:
   (a) an analog-to-digital converter that converts a measured analog voltage amplitude to an uncorrected digital value, wherein the measured analog voltage amplitude and the uncorrected digital value define a point on an uncorrected transfer function of the analog-to-digital converter;

(b) a calibration circuit that receives the uncorrected digital value and outputs a corrected digital value, wherein the uncorrected digital value is associated with a linear segment that passes through a segment endpoint on the uncorrected transfer function, wherein the segment endpoint has an endpoint digital value, wherein the calibration circuit calculates the corrected digital value by subtracting the endpoint digital value from the uncorrected digital value, and wherein the calibration circuit is a processing unit in a microcontroller; and (c) a non-volatile memory, wherein the endpoint digital value is stored in a memory location of the non-volatile memory.

3. An integrated circuit comprising:

(a) an analog-to-digital converter that converts a measured analog voltage amplitude to an uncorrected digital value, wherein the measured analog voltage amplitude and the uncorrected digital value define a point on an uncorrected transfer function of the analog-to-digital converter;

(b) a calibration circuit that receives the uncorrected digital value and outputs a corrected digital value, wherein the uncorrected digital value is associated with a linear segment that passes through a segment endpoint on the uncorrected transfer function, wherein the segment endpoint has an endpoint digital value, and wherein the calibration circuit calculates the corrected digital value by subtracting the endpoint digital value from the uncorrected digital value; and (c) a non-volatile memory, wherein the endpoint digital value is stored in a memory location of the non-volatile memory, wherein the analog-to-digital converter converts a plurality of measured analog voltage amplitudes to a corresponding plurality of uncorrected digital values, wherein the calibration circuit receives the plurality of uncorrected digital values and outputs a corresponding plurality of corrected digital values, wherein each of the corresponding plurality of corrected digital values is one of a predetermined number of digital values, and wherein the non-volatile memory has fewer memory locations than the predetermined number of digital values.

4. An integrated circuit comprising:

(a) an analog-to-digital converter that converts a measured analog voltage amplitude to an uncorrected digital value, wherein the measured analog voltage amplitude and the uncorrected digital value define a point on an uncorrected transfer function of the analog-to-digital converter;

(b) a calibration circuit that receives the uncorrected digital value and outputs a corrected digital value, wherein the uncorrected digital value is associated with a linear segment that passes through a segment endpoint on the uncorrected transfer function, wherein the segment endpoint has an endpoint digital value, wherein the segment endpoint is located on the uncorrected transfer function at a local maximum of a second derivative of the uncorrected transfer function, and wherein the calibration circuit calculates the corrected digital value by subtracting the endpoint digital value from the uncorrected digital value; and (c) a non-volatile memory, wherein the endpoint digital value is stored in a memory location of the non-volatile memory.

5. The integrated circuit of claim 1, wherein the linear segment has a slope, wherein the slope is stored in a second memory location of the nonvolatile memory, and wherein the calibration circuit calculates the corrected digital value using the slope.

6. A method comprising:

(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;

(b) associating the uncorrected digital value with a linear segment that passes through a segment endpoint on the uncorrected transfer function, wherein the segment endpoint has an endpoint digital value; and (c) outputting a corrected digital value corresponding to the measured analog voltage amplitude, wherein the corrected digital value is determined by subtracting the endpoint digital value from the uncorrected digital value.

7. A method comprising:

(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;

(b) associating the uncorrected digital value with a linear segment that passes through a segment endpoint on the uncorrected transfer function, wherein the segment endpoint has an endpoint digital value;

(c) storing the endpoint digital value in a non-volatile memory, wherein the non-volatile memory and the analog-to-digital converter are in a microcontroller; and (d) outputting a corrected digital value corresponding to the measured analog voltage amplitude, wherein the corrected digital value is determined by subtracting the endpoint digital value from the uncorrected digital value.

8. A method comprising:

(a) calculating a second derivative of an uncorrected transfer function of an analog-to-digital converter;

(b) locating a segment endpoint on the uncorrected transfer function at a local maximum of the second derivative of the uncorrected transfer function;

(c) receiving an uncorrected digital value, wherein the analog-to-digital converter converts a measured analog voltage amplitude to the uncorrected digital value, and wherein the measured analog voltage amplitude and the uncorrected digital value define a point on the uncorrected transfer function;

(d) associating the uncorrected digital value with a linear segment that passes through the segment endpoint, wherein the segment endpoint has an endpoint digital value; and (e) outputting a corrected digital value corresponding to the measured analog voltage amplitude, wherein the corrected digital value is determined by subtracting the endpoint digital value from the uncorrected digital value.

9. The method of claim 6, further comprising:
(d) calculating a slope of the linear segment, wherein the corrected digital value is determined using the slope of the linear segment.

10. A method comprising:
(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;
(b) associating the uncorrected digital value with a linear segment that passes through a segment endpoint on the uncorrected transfer function, wherein the segment endpoint has an endpoint digital value;
(c) outputting a corrected digital value corresponding to the measured analog voltage amplitude, wherein the corrected digital value is determined by subtracting the endpoint digital value from the uncorrected digital value;
(d) receiving a second uncorrected digital value, wherein the analog-to-digital converter converts a second measured analog voltage amplitude to the second uncorrected digital value;
(e) associating the second uncorrected digital value with the linear segment; and
(f) outputting a second corrected digital value corresponding to the second measured analog voltage amplitude, wherein the second corrected digital value is determined by subtracting the endpoint digital value from the second uncorrected digital value.

11. A method comprising:
(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;
(b) associating the uncorrected digital value with a linear segment that passes through a segment endpoint on the uncorrected transfer function, wherein the segment endpoint has an endpoint digital value; and
(c) outputting a corrected digital value corresponding to the measured analog voltage amplitude, wherein the corrected digital value is determined by subtracting the endpoint digital value from the uncorrected digital value, wherein the analog-to-digital converter converts multiple measured analog voltage amplitudes to multiple corresponding uncorrected digital values, wherein multiple corrected digital values corresponding to the multiple measured analog voltage amplitudes are output, and wherein each of the multiple corrected digital values is determined using the endpoint digital value.

12. A method comprising:
(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;
(b) associating the uncorrected digital value with a linear segment that passes through a segment endpoint on the uncorrected transfer function, wherein the segment endpoint has an endpoint digital value; and
(c) outputting a corrected digital value corresponding to the measured analog voltage amplitude, wherein the corrected digital value is determined by subtracting the endpoint digital value from the uncorrected digital value, wherein the segment endpoint is located on the uncorrected transfer function such that each point along the linear segment is defined by one of a plurality of measured voltage amplitudes and a corresponding segment digital value, wherein the analog-to-digital converter converts each of the plurality of measured analog voltage amplitudes to a corresponding uncorrected digital value having a least significant bit, and wherein the corresponding segment digital value of each point along the linear segment minus the corresponding uncorrected digital value is less than one half of the least significant bit.

13. A method comprising:
(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;
(b) associating the uncorrected digital value with a linear segment that passes through a segment endpoint on the uncorrected transfer function, wherein the segment endpoint has an endpoint digital value; and
(c) outputting a corrected digital value corresponding to the measured analog voltage amplitude, wherein the corrected digital value is determined by subtracting the endpoint digital value from the uncorrected digital value, wherein a microcontroller comprises the analog-to-digital converter, and wherein the endpoint digital value is stored in the microcontroller.

14. A method comprising:
(a) receiving an uncorrected digital value, wherein an analog-to-digital converter converts a measured analog voltage amplitude to the uncorrected digital value, and wherein the measured analog voltage amplitude and the uncorrected digital value define a point on an uncorrected transfer function of the analog-to-digital converter;
(b) associating the uncorrected digital value with a linear segment that passes through a segment endpoint on the uncorrected transfer function, wherein the segment endpoint has an endpoint digital value; and
(c) outputting a corrected digital value corresponding to the measured analog voltage amplitude, wherein the corrected digital value is determined by subtracting the endpoint digital value from the uncorrected digital value, wherein a local maximum of a second derivative of the uncorrected transfer function has a magnitude greater than a threshold noise level.

15. A computer-readable medium comprising program instructions for calibrating an analog-to-digital converter by performing the steps of:
(a) receiving an uncorrected digital value from the analog-to-digital converter, wherein a measured analog voltage amplitude and the uncorrected digital value define a point on an uncorrected transfer function of the analog-to-digital converter;
(b) calculating a second derivative of the uncorrected transfer function;
(c) locating a segment endpoint on the uncorrected transfer function at a local maximum of the second derivative of the uncorrected transfer function;

(d) associating the uncorrected digital value with a linear segment that passes through the segment endpoint on the uncorrected transfer function;
(e) calculating a slope of the linear segment; and
(f) outputting a corrected digital value corresponding to the measured analog voltage amplitude, wherein the corrected digital value is determined using the slope of the linear segment.

16. The computer-readable medium of claim 15, wherein the segment endpoint has an endpoint digital value, and wherein the corrected digital value is determined by subtracting the endpoint digital value from the uncorrected digital value.

17. The computer-readable medium of claim 15, wherein the local maximum of the second derivative of the uncorrected transfer function is determined by calculating a first derivative of the second derivative of the uncorrected transfer function.

18. The computer-readable medium of claim 15, further comprising:
(g) storing the slope of the linear segment on the computer-readable medium.

19. A device comprising:
(a) an analog-to-digital converter that converts a measured analog voltage amplitude to an uncorrected digital value, wherein the measured analog voltage amplitude and the uncorrected digital value define a point on an uncorrected transfer function of the analog-to-digital converter, wherein the uncorrected digital value is associated with a linear segment that passes through a segment endpoint on the uncorrected transfer function, and wherein the segment endpoint has an endpoint digital value;
(b) a non-volatile memory, wherein the endpoint digital value is stored in the non-volatile memory; and
(c) means for receiving the uncorrected digital value and for outputting a corrected digital value, wherein the means calculates the corrected digital value by subtracting the endpoint digital value from the uncorrected digital value.

20. The device of claim 19, wherein the linear segment has a slope, wherein the slope is stored in the non-volatile memory, and wherein the means calculates the corrected digital value using the slope.

21. A device comprising:
(a) an analog-to-digital converter that converts a measured analog voltage amplitude to an uncorrected digital value, wherein the measured analog voltage amplitude and the uncorrected digital value define a point on an uncorrected transfer function of the analog-to-digital converter, wherein the uncorrected digital value is associated with a linear segment that passes through a segment endpoint on the uncorrected transfer function, and wherein the segment endpoint has an endpoint digital value;
(b) a non-volatile memory, wherein the endpoint digital value is stored in the non-volatile memory; and
(c) means for receiving the uncorrected digital value and for outputting a corrected digital value, wherein the means calculates the corrected digital value by subtracting the endpoint digital value from the uncorrected digital value, wherein the analog-to-digital converter has an ideal linear transfer function for which each of a plurality of measured analog voltage amplitudes corresponds to an ideal digital value, wherein each ideal digital value has a least significant bit, wherein the analog-to-digital converter converts the plurality of measured analog voltage amplitudes to a corresponding plurality of uncorrected digital values, wherein the means receives the plurality of uncorrected digital values and outputs a corresponding plurality of corrected digital values, wherein the ideal digital value that corresponds to each of the plurality of measured analog voltage amplitudes minus the corresponding one of the corresponding plurality of corrected digital values is less than one half of the least significant bit of the ideal digital value.

22. An integrated circuit comprising:
(a) an analog-to-digital converter that converts a measured analog voltage amplitude to an uncorrected digital value, wherein the measured analog voltage amplitude and the uncorrected digital value define a point on an uncorrected transfer function of the analog-to-digital converter;
(b) a calibration circuit that receives the uncorrected digital value and outputs a corrected digital value, wherein the uncorrected digital value is associated with a linear segment that passes through a segment endpoint on the uncorrected transfer function, wherein the segment endpoint is located at an inflection point of the uncorrected transfer function, and wherein the segment endpoint has an endpoint digital value; and
(c) a non-volatile memory, wherein the endpoint digital value is stored in a memory location of the non-volatile memory.

23. The integrated circuit of claim 22, wherein the linear segment has a slope, wherein the slope is stored in a second memory location of the non-volatile memory, and wherein the calibration circuit calculates the corrected digital value using the slope.

24. The integrated circuit of claim 22, wherein the uncorrected transfer function has a second derivative, wherein the second derivative has an absolute value, and wherein the inflection point is located at a local maximum of the absolute value of the second derivative.

25. The integrated circuit of claim 22, wherein the uncorrected transfer function is smoothed.

* * * * *